(12) United States Patent
Aebersold (10) Patent No.: US 10,281,514 B2
(45) Date of Patent: May 7, 2019

(54) METHOD AND DEVICE FOR DETECTING A GROUND-FAULT DIRECTION IN AN ELECTRIC THREE-PHASE NETWORK

(71) Applicant: NSE AG, Wohlen (CH)

(72) Inventor: Andreas Aebersold, Waltenschwil (CH)

(73) Assignee: NSE AG, Wohlen (CH)

( * ) Notice: Subject to any disclaimer, the term of this patent is extended or adjusted under 35 U.S.C. 154(b) by 0 days.

(21) Appl. No.: 15/543,146

(22) PCT Filed: Oct. 6, 2015

(86) PCT No.: PCT/CH2015/000152
§ 371 (c)(1),
(2) Date: Jul. 12, 2017

(87) PCT Pub. No.: WO2016/112470
PCT Pub. Date: Jul. 21, 2016

(65) Prior Publication Data
US 2018/0011135 A1    Jan. 11, 2018

(30) Foreign Application Priority Data

Jan. 15, 2015 (EP) .................... 15000088

(51) Int. Cl.
| | |
|---|---|
| *G01R 31/08* | (2006.01) |
| *H02H 3/16* | (2006.01) |
| *H02H 3/38* | (2006.01) |
| *H02H 3/42* | (2006.01) |
| *G01R 31/02* | (2006.01) |

(Continued)

(52) U.S. Cl.
CPC ......... *G01R 31/08* (2013.01); *G01R 31/025* (2013.01); *G01R 31/44* (2013.01); *H02H 1/0007* (2013.01); *H02H 3/165* (2013.01); *H02H 3/385* (2013.01); *H02H 3/422* (2013.01)

(58) Field of Classification Search
None
See application file for complete search history.

(56) References Cited

U.S. PATENT DOCUMENTS

2012/0123708 A1* 5/2012 Dong .................. G01R 31/025
702/58

FOREIGN PATENT DOCUMENTS

| CH | 10302451 | 7/2004 |
| CH | 703900 | 4/2012 |
| DE | 19901789 | 7/2000 |

OTHER PUBLICATIONS

International Search Report for PCT application No. PCT/CH2015/000152 completed on Dec. 15, 2015 and dated Dec. 22, 2015.

* cited by examiner

*Primary Examiner* — Clayton E. LaBalle
*Assistant Examiner* — Jas A Sanghera
(74) *Attorney, Agent, or Firm* — Cooper & Dunham LLP (57) ABSTRACT

The invention relates to a method for ascertaining an earth fault and the earth-fault direction in a three-phase network which is operated in a compensated manner or in an insulated manner. Value pairs of a zero voltage and a zero current are measured, the active or reactive energy is calculated, and a voltage flag and a current flag are combined by a Boolean link, wherein the presence of a earth fault is ascertained depending on the result, and a decision is made as to whether the earth-fault direction is signalled as "forward" or "reverse" at least on the basis of the sign of the active or reactive energy.

12 Claims, 10 Drawing Sheets

(51) Int. Cl.
*H02H 1/00* (2006.01)
*G01R 31/44* (2006.01)

METHOD AND DEVICE FOR DETECTING A GROUND-FAULT DIRECTION IN AN ELECTRIC THREE-PHASE NETWORK

CROSS REFERENCE TO RELATED APPLICATIONS

This application is a § 371 national stage of PCT International Application No. PCT/AU2015/000152, filed Oct. 6, 2015 claiming priority of European Patent Application 15000088.3, filed Jan. 15, 2015, the contents of each of which are incorporated herein by reference in their entireties.

BACKGROUND OF THE INVENTION

The invention relates to a method for ascertaining the earth fault direction in an electric three-phase network which is operated in a compensated way or in an isolated way, respectively. Furthermore, the invention relates to a device for ascertaining the earth fault direction in an electric three-phase network, corresponding to each one of the methods.

PRIOR ART

A considerable part of the operation failures of electric supply networks of energy suppliers arises due to single-phase faults and particularly earth faults. Such faults may e.g. arise due to falling trees or trees growing into a power line or due to faulty insulation. So-called earth fault directional relays basically report also in meshed networks selectively the lines affected by earth faults. The summed zero current and the zero sequence voltage serve as measurement criterion, from which the earth fault direction is determined. This wattmetric acquisition of the earth fault direction is done in a network operated in an isolated way (with sin φ-relay) differently than in networks operated in a compensated way (with cos φ-relay). However, in case of intermittent earth faults, simple earth fault directional relays fail because after a reignition the direction is not recognized reliably.

Regarding neutral point treatment, the following can generally be said: in case an electrically conductive connection occurs between an external conductor line and earth, the type of neutral point treatment determines the behavior of the network. In this case it is irrelevant if the neutral point is a transformer or a generator. In principle, there are five distinct types of neutral point earthing (SPE) which impose very different challenges to the network design.

(1) Solid earthing. The neutral point is connected to the earth potential via an as much as possible impedance-less connection via an extended earthing installation. The advantages are that no voltage overshoots occur on the non-affected conductor lines and the simple fault localization with directed overcurrent protection. The disadvantages are that the earth fault transforms into an earth short-circuit, that a high thermal stress of the conductor lines results due to earth short-circuit currents, and that a high contact voltage is possible at the fault location. Further disadvantages are a high complexity for the earthing installation and the power distribution cut due to switching off.

(2) Isolated neutral point earthing. In this case the source neutral point is not connected to earth. The advantages are that a smaller complexity and the reduced stress of the conductor lines result due to the capacitive earth fault current as well as lower contact voltages at the fault location. The network can still be operated in case of earth fault and arc faults can extinguish by themselves. Disadvantages are voltage overshoots with the factor $\sqrt{3}$ on the conductor lines which are not affected by the fault and that the earth fault current can still get very high in case of large cable networks. The direction determination requires furthermore special earth fault directional relays.

(3) Low ohmic neutral point earthing. In this case, the source neutral point is connected to the earth potential via a defined ohmic impedance. This alternative is used when a solid earthing leads to inadmissible earth short-circuit currents, but the voltage overshoot of networks operated in an isolated way is not acceptable. The advantages are the limitation of the earth short-circuit current and of the occurring voltage overshoots. Furthermore, a simple fault localisation with directed overcurrent protection results. Disadvantages are the voltage overshoots on the conductor lines which are not affected by the fault and the transformation of the earth fault into an earth short-circuit fault and therefore also the thermal stress of the conductor lines due to earth short-circuit currents. Furthermore, an increased contact voltage is possible at the fault location. Additionally, a high effort for the earthing installation and the supply interruption due to switching off results.

(4) The short-term low ohmic neutral point earthing. In this case, the source neutral point is isolated during normal operation. In order to determine the direction, an ohmic resistance is switched into the neutral point for a short term and the earth fault is transformed into an earth short-circuit. After the direction detection and switching off of the affected sections, the network is again operated in an isolated way. Advantages are that the earth short-circuit current is limited and a simple fault localisation with directed overcurrent protection is possible. Disadvantages are a voltage overshoot with the factor $\sqrt{3}$ the conductor lines which are not affected by the fault and the earth fault is transformed into an earth short-circuit fault. Thus, thermal stress of the conductor lines due to earth short-circuit currents results and also an increased contact voltage at the fault location is possible. Furthermore, a high effort for the earthing installation and the supply interruption due to switching off results.

(5) The compensated/arc-suppression neutral point earthing. In this case, the source neutral point is connected to the earth potential via an adjustable inductor. The value of the inductor or the arc suppression coil (also named Petersen coil after its creator), respectively, defines the compensation current. The advantages are as small as possible earth fault currents and an as small as possible contact voltage at the fault location. Furthermore, the network may still be operated in case of an earth fault and arc faults may extinguish by themselves. Disadvantages may be: increased initial costs and maintenance effort for the arc suppression coil, a high effort for the earthing installation and a voltage overshoot with the factor $\sqrt{3}$ on the conductor lines which are not affected by the fault. Furthermore, a high effort for the earth fault direction detection arises due to the reduced currents as well as particularly a problem with intermittent earth faults.

Figure 1:
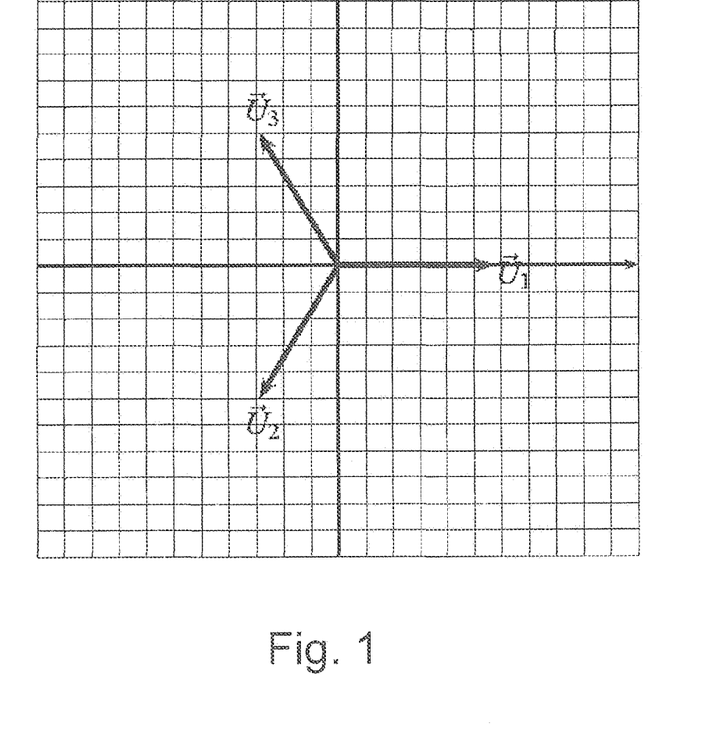
FIG. 1 a pointer diagram of the healthy network.
Figure 2:
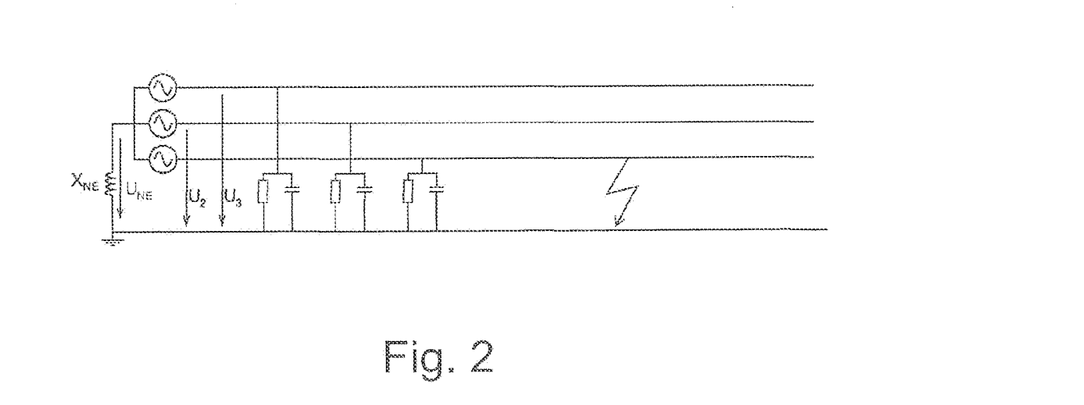
FIG. 2 a network model with earth fault.
Figure 3:
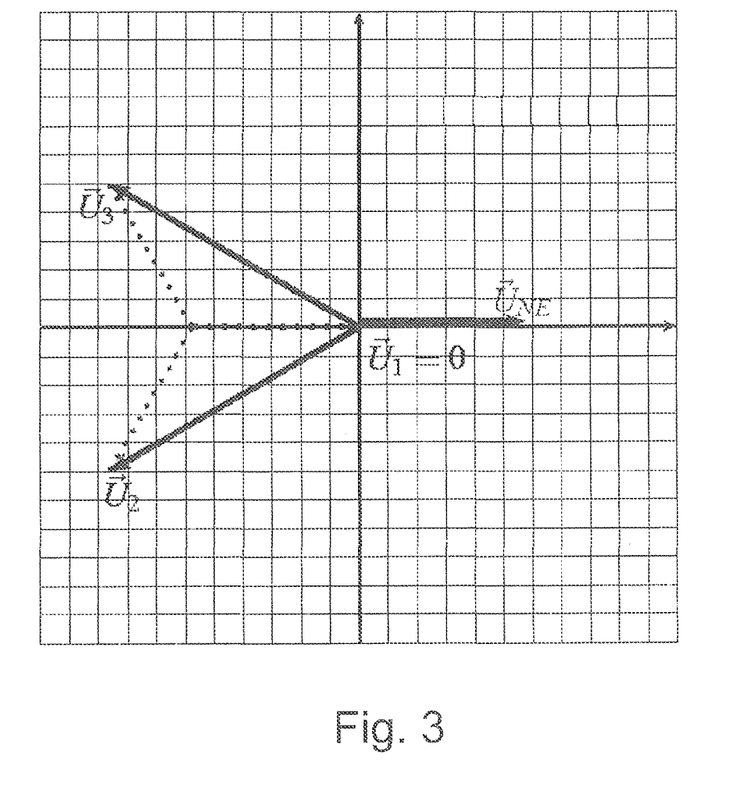
FIG. 3 a pointer diagram of the network with an earth fault.

In the following, the earth fault in the compensated network is described in more detail. If a healthy three-phase system (FIG. 1) is affected by an earth fault on conductor line 1 in the compensated network, as shown schematically in FIG. 2, the result is a shifting of the voltage triangle (FIG. 3). The zero-sequence voltage (neutral point to earth voltage) $\vec{U}_{NE}$ points from the middle of the voltage triangle in direction of the earth fault (in FIG. 3, the vector is drawn starting from the origin for better clarity). The following applies:

$$\vec{U}_{NE} = -\frac{1}{3} \cdot \sum \vec{U}_X = -\frac{1}{3} \cdot (\vec{U}_1 + \vec{U}_2 + \vec{U}_3) \quad (1)$$

Figure 4:
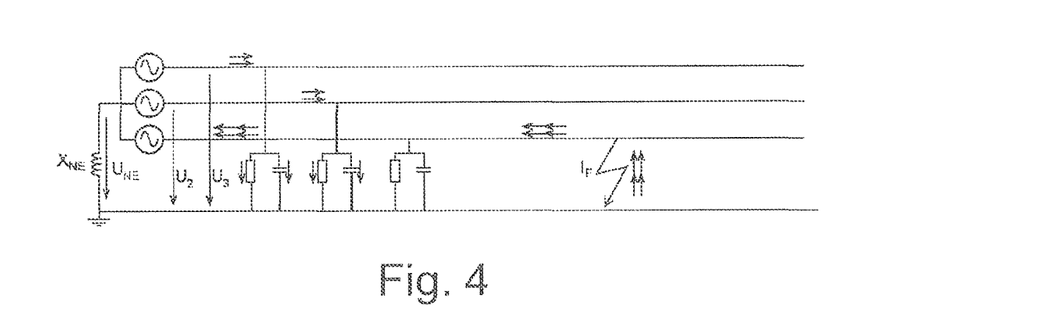
FIG. 4 the network model with current distribution without compensation current.
Figure 5:
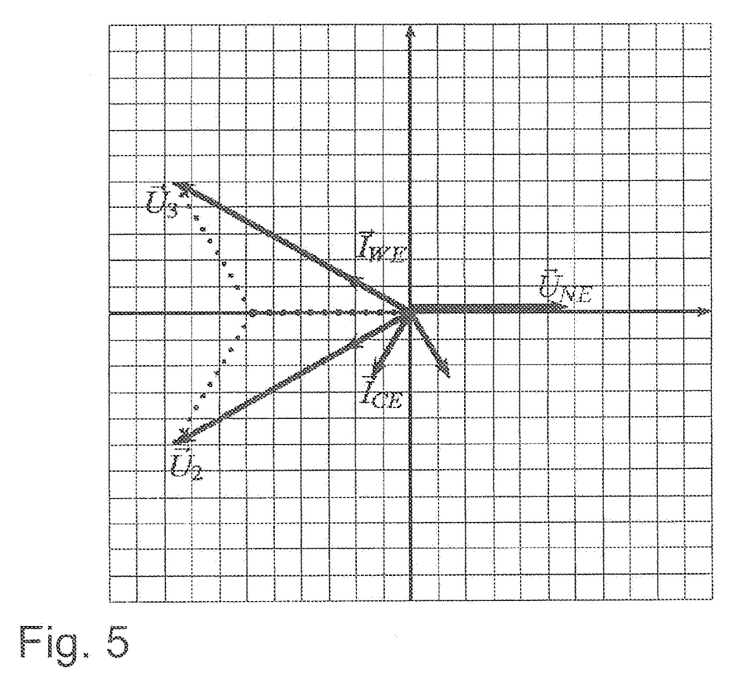
FIG. 5 the line currents for FIG. 4 in a pointer diagram.
Figure 6:
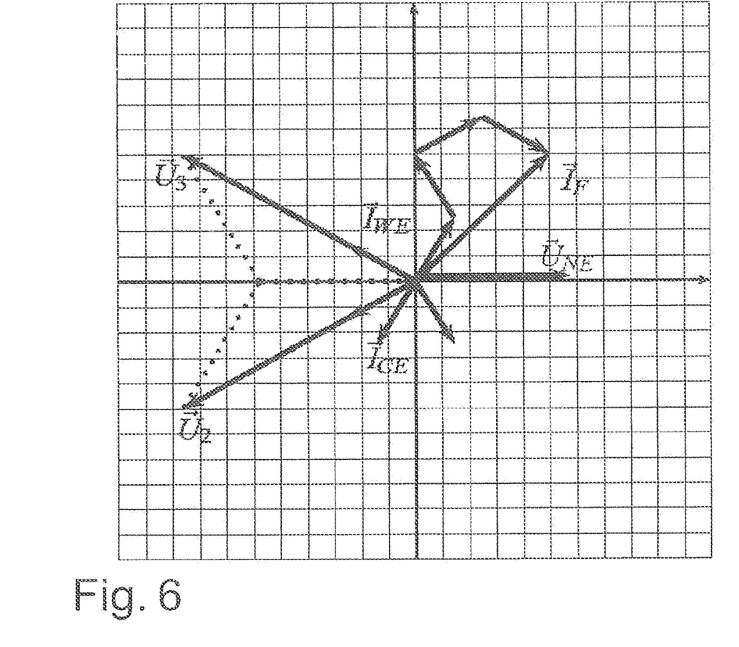
FIG. 6 the fault current in a pointer diagram.

The conductor line to earth voltages of the healthy conductor lines increase to the value of the line-to-line voltages, which correspond exactly to √3 times the value. The excessive conductor line to earth voltage forces a current into earth via the bleeder resistors and the leakage capacitances of the conductor lines, the sum of which flows back into the faulty conductor line at the fault location as fault current $I_F$ (FIG. 4). The line currents are shown in FIG. 5 and the fault current is shown in FIG. 6. The summed current is still zero in FIG. 6. A summed current is measurable only after adding a further line which is composed of the flow-back currents of the other lines and is called $I_E$. Thus, it is possible to determine that the value of the measured summed current doesn't correspond to the fault current but is defined only by neighboring branches. The corresponding illustration is not shown here.

Figure 7:
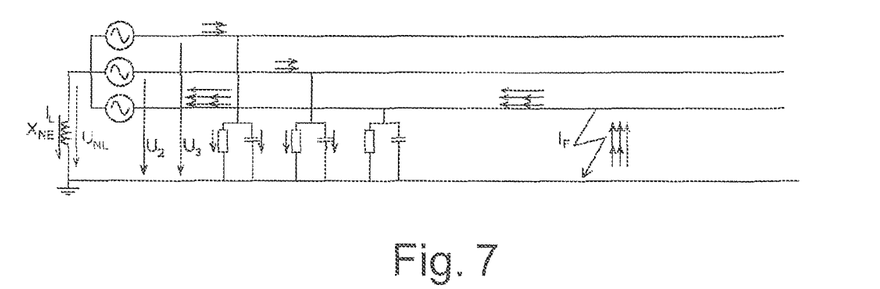
FIG. 7 the network model with compensation current,
FIG. 8 the line currents for FIG. 7 in a pointer diagram.
Figure 8:
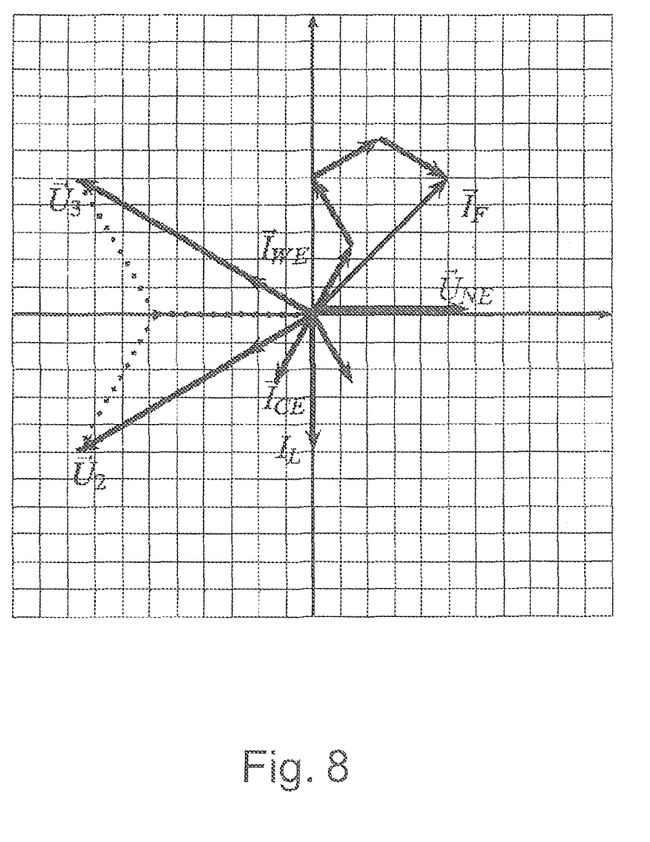
Figure 9:
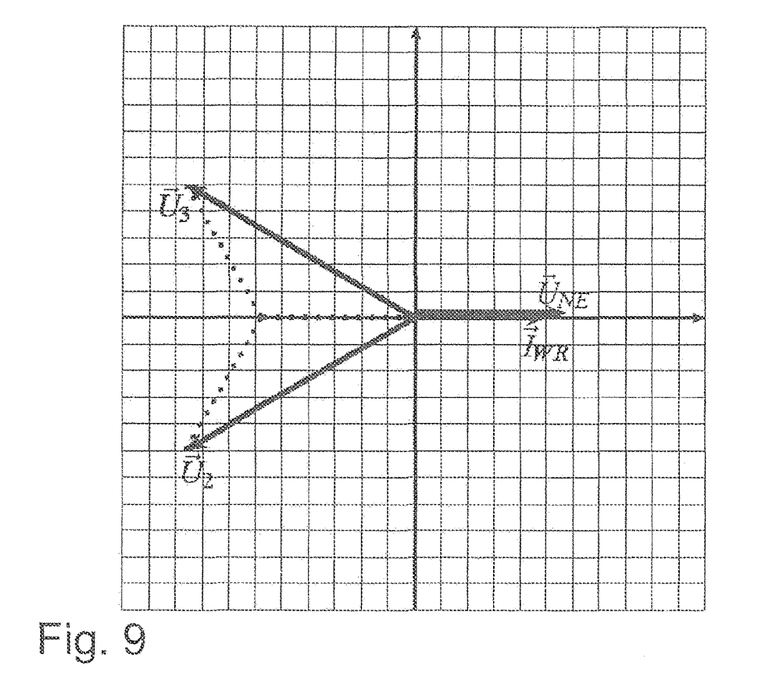
FIG. 9 the fault current in a pointer diagram.
Figure 10:
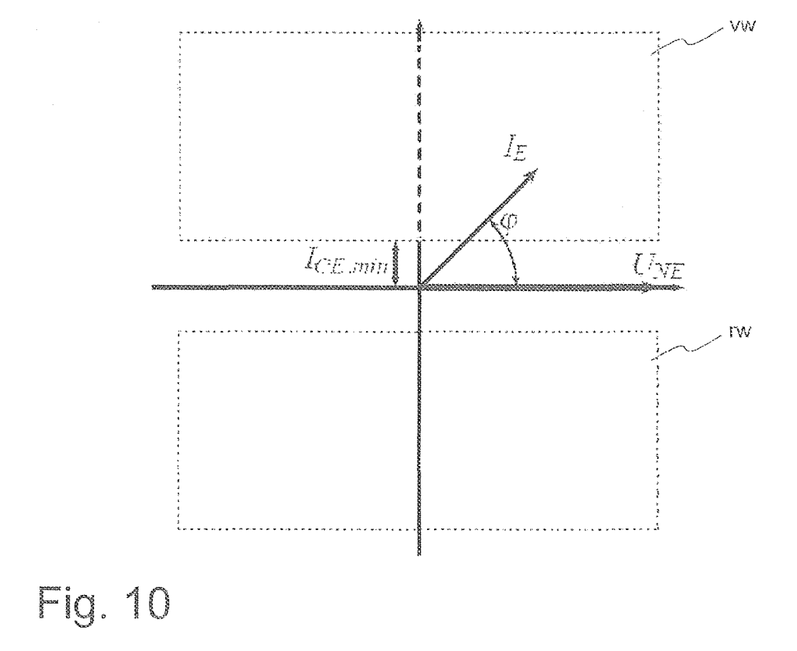
FIG. 10 a pointer diagram for the sine circuit.
Figure 11:
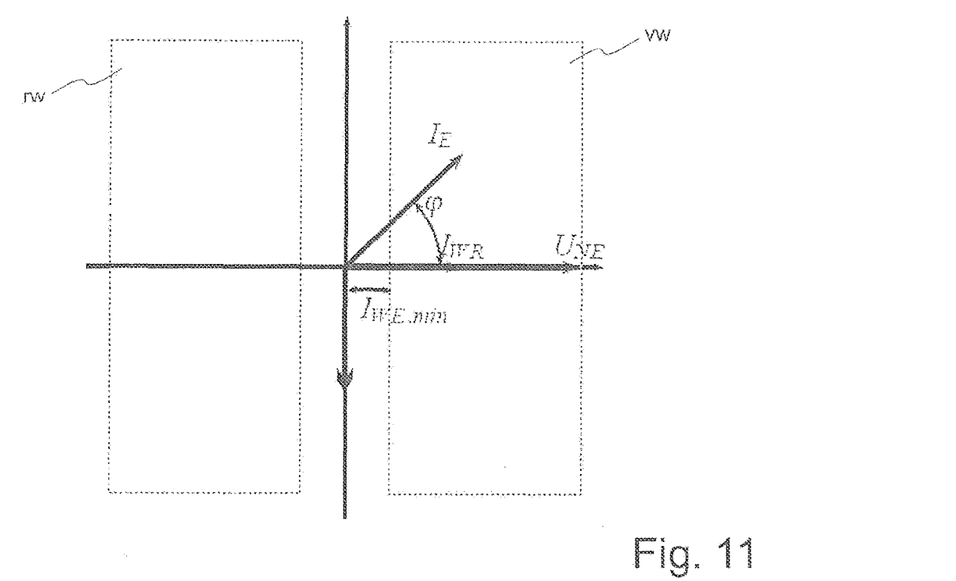
FIG. 11 a pointer diagram for the cosine circuit.

In the compensated network, only the current from the Petersen coil or arc suppression coil, respectively, is added at the fault location. It is driven by the voltage and it is lagging behind the latter by 90°; FIGS. 7, 8 and 9 show this situation. Depending on the value of the compensation current, the charging current flowing at the fault location is more or less compensated. In case of an ideal compensation only the residual active current $I_{WR}$ remains as current at the fault location. As known, the direction determination in case of an earth fault is performed by detection devices or protection devices (earth fault relays), respectively, in the following way:

The directional features shown in FIGS. 10 and 11 are described by simple equations. For the sine circuit:

$$I_E \cdot \sin \varphi > |I_{CE,min}| \Rightarrow \text{forward} \quad (2)$$

$$I_E \cdot \sin \varphi > -|I_{CE,min}| \Rightarrow \text{backward} \quad (3)$$

For the cosine circuit:

$$I_E \cdot \cos \varphi > |I_{WE,min}| \Rightarrow \text{forward} \quad (2)$$

$$I_E \cdot \cos \varphi > -|I_{WE,min}| \Rightarrow \text{backward} \quad (3)$$

The angle φ is the angle between the zero-sequence voltage $U_{NE}$ and the earth current $I_E$ and plays a decisive role for the direction detection. However, a direction detection with this approach according to the prior art is not possible in case of an intermittent earth fault; such intermittent earth faults are therefore a problem. Isolated and compensated networks may under circumstances still be operated for a long time in case of an earth fault. In order to be able to quickly narrow down the fault, standard earth fault relays, e.g. the DIGISAVE RD, of the company NSE GmbH, Switzerland, are used. Earth fault relays detect the direction of the fault by the angle between the zero-sequence voltage $U_{NE}$ and the earth current $I_E$, as described above, by the so-called cosine circuit in a compensated network and by the sine circuit in an isolated network. However, in a compensated network the earth fault current may get so small that the fault arc is extinguished immediately. Hence, the line voltage of the faulty conductor line returns and as soon as it exceeds a critical value, a new ignition occurs. This process is called intermittent earth fault. The problem for the earth fault direction detection according to the prior art is that at the moment of the reignition a recharge current $I_U$ flows into the two healthy conductor lines. This pulse current has an opposite direction with respect to the zero-sequence voltage $U_{NE}$.

$$I_U \sim \frac{dU}{dt} \quad (6)$$

Figure 12:
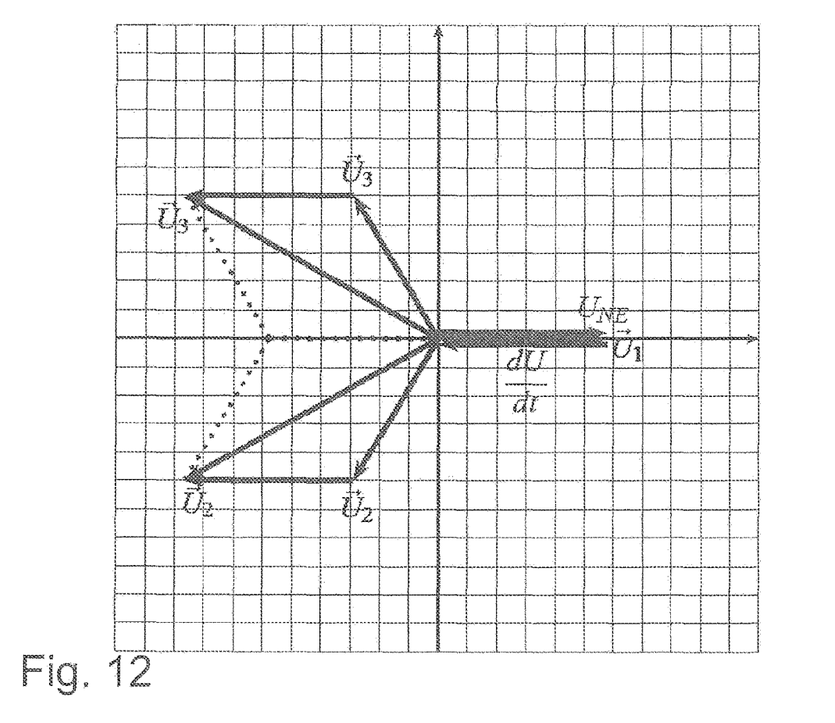
FIG. 12 the pointer diagram of the ignition process in case of the intermittent earth fault.
Figure 13:
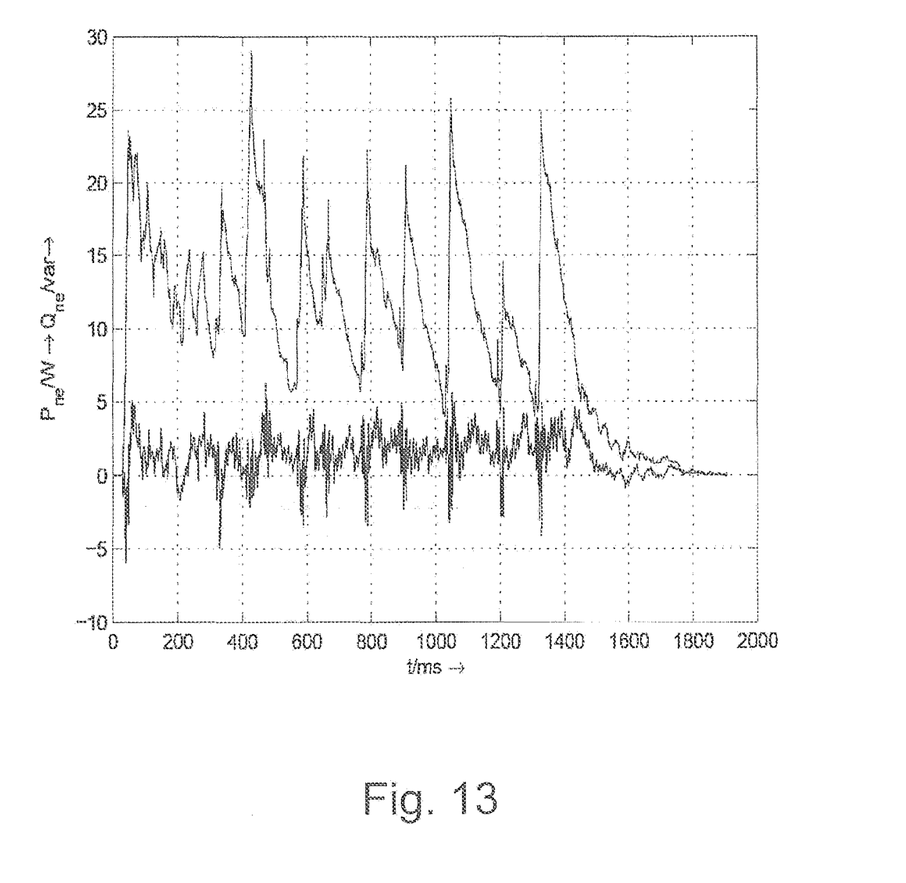
FIG. 13 the zero sequence powers.

This is an active current because energy stored in the capacitor must be firstly provided by the network. FIG. 12 shows the pointer diagram of the ignition process. For illustrating the situation in case of an intermittent earth fault, the power developments are shown in FIG. 13 in the zero sequence by using $U_{NE}$ and $I_E$. One can see that the active power $P_{NE}$ changes the sign for a short period for each ignition pulse. The reactive power $Q_{NE}$ has a sawtooth pattern. Due to the repeated change of sign of the active current, an earth fault direction protection also repeatedly changes the sign without suppression of the intermittent earth faults.

In the following, the calculation of the active energy or the reactive energy, respectively, for determining the direction of an earth fault, particularly of an intermittent earth fault, is described, because this process is the basis of this method of the present invention.

For this, the process is such that the direction is detected by the sign of the used zero sequence active energy. Despite the fact that the current flow direction points to the wrong earth fault direction during the ignition process of the intermittent fault, still an average power result in forward direction, such that in case of a positive sign of the used zero sequence active energy the forward direction of the earth fault can be shown and in case of a negative sign the backward direction of the earth fault can be shown.

The zero sequence active energy is calculated as follows $$E_0 = \Sigma_{n=nx-nFE}{}^{nx} u_0(n) \cdot i_0(n) \quad (7)$$

The meaning of the used symbols is the following:
$E_0$ zero sequence active energy
$u_0(n)$ zero voltage
$i_0(n)$ zero current
nFE set integration time window at sampling points
nx current time According to the invention, the procedure for detecting the earth fault direction in the three phase network operated in an isolated way is such that the direction is determined by the sign of the exchanged zero sequence reactive energy. Despite the fact that the current flow direction points to the wrong earth fault direction during the ignition process of the intermittent fault, still an exchange in forward direction results, such that in case of a positive sign of the exchanged zero sequence reactive energy the forward direction of the earth fault can be shown and in case of a negative sign the backward direction of the earth fault can be shown.

The zero sequence reactive energy is calculated as follows $$E_{b0} = \Sigma_{n=nx-nFE}{}^{nx} u_0(n) \cdot i_0(n-N/4) \quad (8)$$

The above symbols are valid and additionally the following symbols:
$E_{b0}$ zero sequence reactive energy
N number of sampling points per network period (f=50 Hz=>N=20)

DESCRIPTION OF THE INVENTION

Accordingly, the invention has the objective to further improve the detection of the earth fault direction in case of intermittent earth faults with respect to reliability.

This objective is reached for the method mentioned at the beginning with the features of the independent method claims, each one for a three-phase network operated in a compensated way or in an isolated way, respectively. In case of the above mentioned devices, the objective is reached with the features of the independent device claims, accordingly for a three-phase network operated in a compensated way or in an isolated way, respectively.

It was noticed that the present invention brings about an improvement of the reliability of detection of earth faults and of their direction. Furthermore it is possible to identify and localize an earth fault without knowing the exact time of the fault initiation.

Preferred embodiments of the method and of the device are defined in the dependent claims and these and other embodiments are described by the following description.

SHORT DESCRIPTION OF THE DRAWINGS

In the following, the prior art and embodiments of the invention are described in more detail by means of the figures. Thereby it is shown in.

WAYS OF CARRYING OUT THE INVENTION

Figure 14:
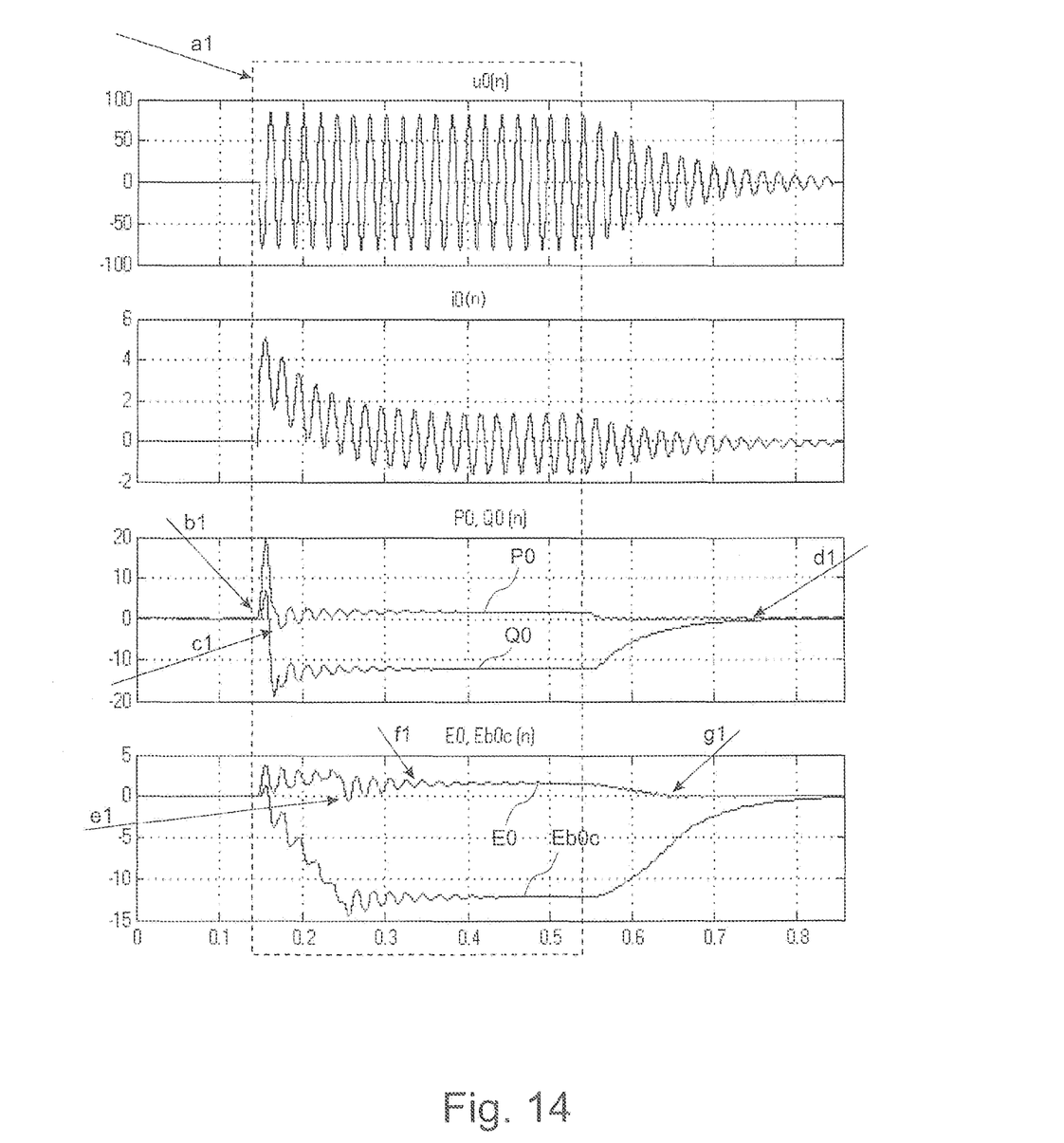
FIG. 14 a diagram with a time-base illustration of relevant variables during simulation of an earth fault.
Figure 15:
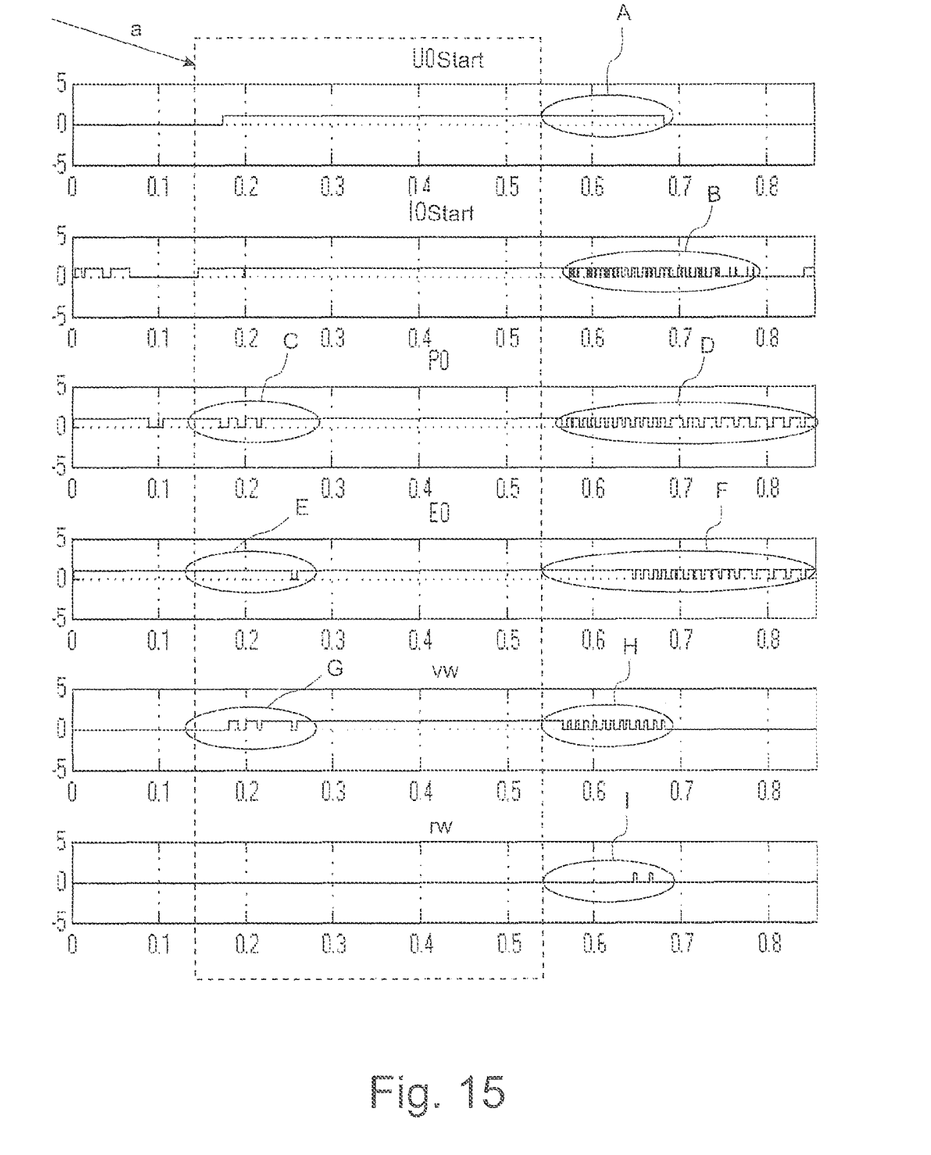
FIG. 15 a diagram with a development of the relevant values during the simulation of FIG. 14 without applying the invention, and
FIG. 16 a diagram with a development of the relevant values during the simulation of FIG. 14 when the invention is applied.
Figure 16:
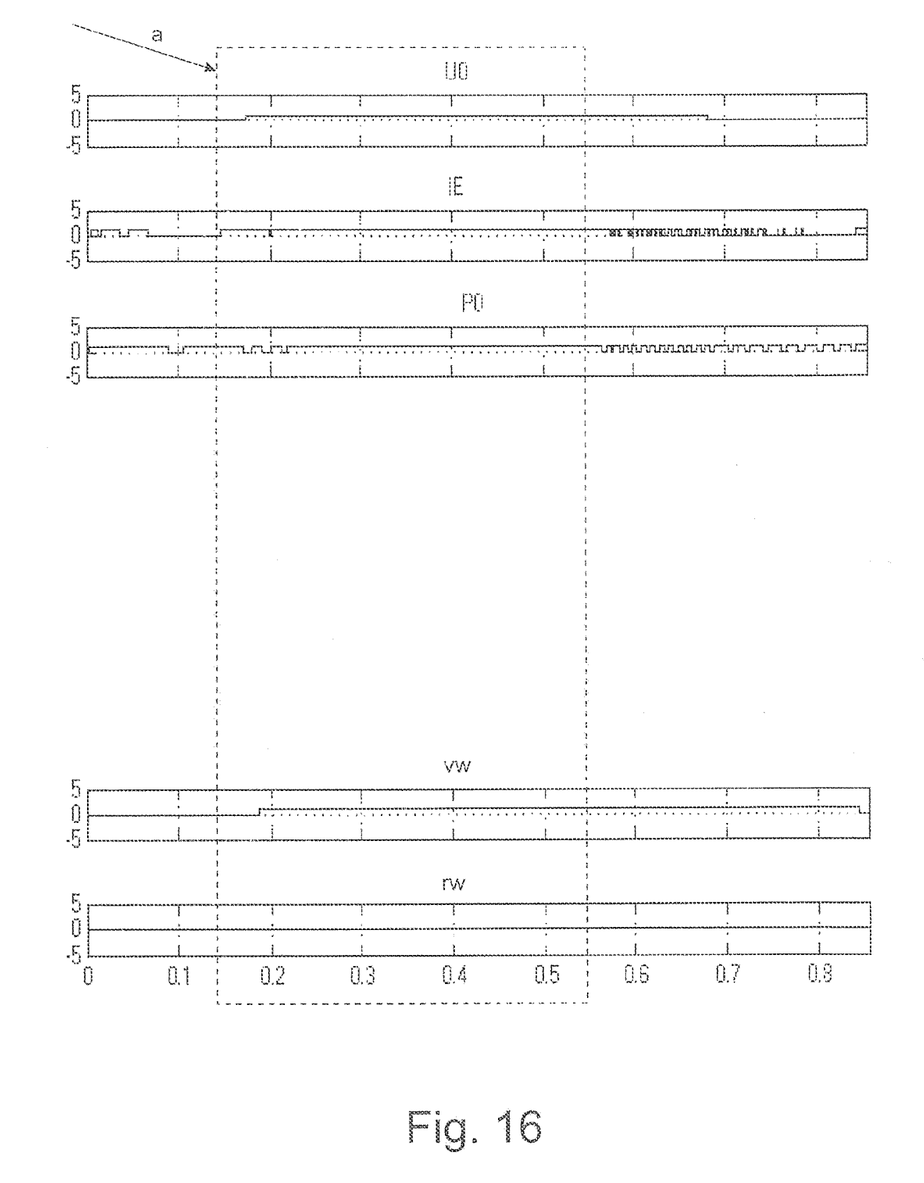

In the following, FIGS. 14 to 16 are described in more detail. FIGS. 1 to 13 describe the prior art and were discussed in the respective section.

FIG. 14 shows a diagram with a timeline development of relevant variables during simulation of an earth fault in forward direction in a three-phase network operated in a compensated way. Some positions of the curves in the diagrams, which require special attention, are marked with arrows or circles. The time window from the beginning of an earth fault in a line (single-pole earth fault) until its end is denoted by the reference a1, which is also valid for the subsequent figures. In the figures, the amplitude of the respective signal is shown over time (in seconds).

The developments of the zero voltage $U0(n)$ and of the zero current $I0(n)$ are shown in the upper parts of the diagram of FIG. 14, wherein n denotes discrete time instances. In case of the zero current, a falling DC component of I0, which originates from the Petersen coil, is also taken into account.

The third part of the diagram shows the power $P0(n)$ or the charge $Q0(n)$, respectively. The arrow b1 shows that the power P0 increases positively at the beginning of the earth fault in a correct way, however it performs a falling oscillation (arrow c1) in the further development, wherein the sign of the power P0 is many times negative for a maximum of around 10 ms during this transient response. Subsequently, the power stabilises to a small positive value. After the end of the earth fault, the value of the power P0 falls, however its sign alternates continuously (arrow d1).

The bottom part of the diagram shows the development of the active energy E0. The development of the energy E0 follows the development of the power P0 and has therefore also the short sign change (arrow e1). The energy E0 is also negative, however, like in case of the power P0, only for maximum around 10 ms in this example. After about 100 ms (arrow f1), the energy stabilizes to a correct positive value. Around 100 ms after the end of the earth fault, the energy E0 decreases to a very small value (arrow g1).

It is noted that the developments of the reactive power Q0 and the reactive energy Eb0c shown in FIG. 14 are relevant only for isolated neutral point earthing.

FIG. 15 shows a diagram with a development of relevant variables for the simulation of FIG. 14 without application of the invention. All values are shown as binary values.

The upper two parts of the diagram show indicators (flags) for the zero voltage U0 and the zero current I0 ($U0_{Start}$, $I0_{Start}$). According to FIG. 14, the zero voltage U0 is still present for about 100 ms after the end of the earth fault (circle A). The measurement of the zero current proves unstable (see circle B) corresponding to the power P0 (circle D), which is visible by the change of the zero current flag.

According to FIG. 14, the power P0 also assumes negative values (circle C) during the transient response. After the end of the earth fault, the sign of the power P0 changes first with 100 Hz, because the period duration of the power is of 100 Hz (visible in the diagram e.g. at 0.7 seconds), and later of 50 Hz due to the 50 Hz period of the zero voltage for DC current.

The fourth part of the diagram shows the development of the energy E0. Equivalent to FIG. 14, the energy assumes a negative value (circle E) after about 100 ms and follows the development of the power P0 after the end of the earth fault. (circle F).

The fifth part of the diagram shows the forward direction decision (vw). In this context it gets clear that the latter is unstable in the beginning section of the earth fault (circle G). A cause for this is the sign change of the power P0, wherein the instability of the decision is shown in the range of 0.2 seconds in the diagram. A second cause is the sign change of the energy E0 at about 0.26 seconds. Furthermore, the forward decision is also unstable (circle H) after the end of the earth fault due to the fall back of the zero current I0 (see $I0_{Start}$ flag).

The sixth part of the diagram shows the backward direction decision (rw). The latter is wrong for periods of time (circle I) in the area after the end of the earth fault due to the sign change of the power P0 or of the energy E0, respectively, and because the flag U0 is still on during these time instants. The cause for this is the slow disappearing of the zero voltage and the zero current after the end of the earth fault, wherein the result is a power P0 or energy E0, respectively, which is not relevant for the direction determination.

The present invention overcomes the uncertainties of the fault evaluation mentioned above, which is shown in FIG. 16.

FIG. 16 shows a diagram with a development of the relevant variables for the simulation of FIG. 14 while applying the invention.

The upper three parts of the diagram correspond to the already discussed states of the current flags or voltage flags, respectively, and the power P0. The bottom two part of the diagram show the direction decisions for the forward direction (vw) and for the backward direction (rw). As can be seen therein, in the present example of a forward earth fault a correct decision of the earth fault direction is also taken during the transient time at the beginning of the fault and during the time immediately after the end of the fault.

In the following, the method of the invention is described in more detail. Again, only the three-phase network which is operated in a compensated way is taken as an example, because the corresponding concepts are also valid for isolated networks in case of which the reactive power is regarded.

The method for determining an earth fault and the earth fault direction in a three-phase network which is operated in a compensated way comprises the now following steps.

In a first step a) value pairs of a zero voltage U0 and of a zero current I0 are continuously measured, wherein the value pairs are each attributed to a measurement time. The measurement is done with a given sample rate. The sample rate is preferably set before a first measurement of the zero current and the zero voltage and is preferably of one millisecond. According to the Nyquist-Shannon sample theorem, a lowpass filter for avoiding artefacts due to higher signal frequency components is applied before sampling, which is not further explained here.

Recording of the determined value pairs and the attributed measurement time has also been included in step a).

In a step b), the active energy is calculated by first continuously calculating a product of the measured zero voltage and the measured zero current for each measurement time and by subsequently building a sum of the products. The sum is calculated with a product which is attributed to the current measurement time and a number of preceding products. In this context it is noted that the variables attributed to the current measurement time shall always be assumed as included in the present context while calculating the sum.

For calculating the sum, the sum of step b) is determined in such a way that for each calculation the product attributed to the current measurement time is summed up to the sum and an oldest product is excluded from the sum. The sum is calculated on the basis of an adjustable, constant number of value pairs. In other words, a constant integration window with the width nFE travels to the right on the abscissa (see FIG. 16). Consequently, the measurement time considered earliest for the sum is nx-nFE, wherein nx is the current measurement time. Thus, the sum is calculated over the span from the time instant nx-nFE up to nx (see equation 7).

In a step c), the voltage flag $U0_{Start}$ is set to 1 for the current measurement time, if the attributed zero voltage U0 is greater than a first threshold value and else to 0, and a current flag $I0_{Start}$ is set to 1 if the attributed zero current I0 is greater than a second threshold value and else to 0. The first and/or the second threshold value are preferably set before a first measurement of the zero current I0 and of the zero voltage U0.

In a step d), a Boolean AND-operation with the voltage flag $U0_{Start}$ and the current flag $I0_{Start}$ is performed for each current measurement time. Now it is decided if an earth fault is present; no earth fault is present in case of a result of 0 and an earth fault is present in case of a result of 1. However, this initial condition for the evaluation of the energy criterion holds an uncertainty for the reasons set forth. When the earth fault starts, the initial condition may fall back repeatedly for around 5 to 10 ms (see FIG. 15, circle C in connection with circle G) due to the used power. At the end of the earth fault, it only disappears entirely after the end of the integration window and tends to periodic response with frequencies of 50 Hz or 100 Hz during the time window (see FIG. 15, circle D in connection with circle H).

In order to solve the problem at the beginning of the earth fault, a result of the Boolean AND-operation is ON-delayed by a first time interval. The first time interval is set before a first measurement of the zero current and of the zero voltage. Preferably, it is 15 ms. In this way it is possible to overcome the decision uncertainties due to the sign change during the transient process, which was described in connection with FIG. 15, because a result of 1 (earth fault is present) is only validated if the first time interval has passed and the result hasn't fallen back to 0 during this time. In the latter case, the first time interval starts again and it is assumed that no earth fault is present, like in the normal case of a result which equals 0.

In order to solve the problem at the end of the earth fault, the result is release-delayed by a second time interval. The second time interval is set before a first measurement of the zero current and of the zero voltage. Preferably, it is 15 ms. In a way analog to the ON-delay it is thereby possible to overcome the decision uncertainties due to the sign change at the end of the earth fault, which was described in connection with FIG. 15, because a result of 0 (earth fault is not present anymore) is only validated if the second time interval has passed and the result hasn't fallen back to 1 during this time. In the latter case, the second time interval starts again and it is assumed that an earth fault is still present, like in the normal case of a result which equals 1.

Now, if the decision that an earth fault is present has been taken with certainty, in a step e) the steps a) to d) are still executed and the algebraic sign of the active energy calculated up to the current measurement time is verified. In this context it is noted that the steps a) to d) are always carried out, independently if an earth fault has been detected or not, and independently if an earth fault end has been detected. A result of the verification is ON-delayed by a third time interval and release-delayed by a fourth time interval. The third time interval and/or the fourth time interval are set before a first measurement of the zero current and of the zero voltage. Preferably, both time intervals are chosen from a range between 30 ms and 2000 ms, wherein a value of 300 ms is preferred for a three-phase network operated in a compensated way and a value of 50 ms is preferred for a three-phase network operated in an isolated way. The span of the time intervals is founded by the possibility of the presence of an intermittent fault.

In case of intermittent faults, longer pauses occur in the compensated network between the consecutive earth faults (e.g. in the order of 100 ms), according to the voltage which rises again after extinction of the arc. The smaller the artefact, the longer it takes for the voltage to come back.

In case of intermittent faults in the isolated network, the pauses between the consecutive earth faults are most of the time short (e.g. in the order of 10 ms), because the voltage comes back immediately and therefore an instantaneous reignition of the arc occurs.

Hence, the direction decisions are issued release-delayed, as mentioned, depending on the network, e.g. in the range between 30 and 2000 ms.

The third and the fourth time intervals of the direction decision are therefore chosen to be parametrizable for intermittent faults. Alternatively, they are chosen according to the setting isolated/compensated. The third and the fourth time intervals are therefore chosen according to the duration of the earth-fault-free pause.

In a last step f), it is decided at least on the base of the algebraic sign of the active energy, if the earth fault direction is reported as "forward", in case of a positive algebraic sign, or as "backward" in case of a negative algebraic sign. It is noted that a report of the earth fault direction as "forward" in case of a negative sign and as "backward" in case of a positive sign are equivalent if the differing sign is only given by the point of view of the direction of the voltage vector.

It is preferred, additionally to the decision based on the algebraic sign of the active energy or of the reactive energy, to perform a verification of an algebraic sign of the power P0 by integrating the products of the zero voltage and of the zero current over a period of the network frequency, which includes the current measurement time, wherein the earth fault direction is confirmed if the algebraic sign of the active energy or the reactive energy corresponds to the one of the power P0. This is attributed to the fact that in many cases the power changes direction with a frequency of about 100 Hz. For this reason, the power direction can be used for releasing the energy criterion, e.g. when the power has meanwhile changed its direction but the integral of the energy has not yet gone down.

The report of the earth fault direction is preferably carried out by setting or not setting forward flags or backward flags, respectively, in a memory. Based on these flags it e.g. possible to separate the affected network section, e.g. by a certain command to a high voltage switch, as reaction to the detection of an earth fault, like in the present example of a forward earth fault.

It proves advantageous for the execution if the report is issued only when a minimum value of the residual active current $I_{WE}$ (second threshold) occurs in the compensated network or when a minimum value of the capacitive earth fault current $I_{CE}$ (second threshold) occurs in the isolated network. The minimum values shall be adjustable by choice. Preferably, the values $I_{WE}$ or $I_{CE}$, respectively, are determined from $E_0$ or from $E_{b0}$, respectively, in the following way:

$$U_{NE,\Sigma} = \sqrt{\frac{1}{nFE} \sum_{nx-nFE}^{n_x} u_{NE}^2(n)} \quad (9)$$

$$I_{WE} = \frac{E_0}{U_{NE,\Sigma}} \quad (10)$$

$$I_{CE} = \frac{E_{b0}}{U_{NE,\Sigma}} \quad (11)$$

The logic operation of the variables can be shown as follows, wherein it is always valid that an earth fault is present and that the zero voltage is greater than the set value. Preferably, the reports are issued as forward flags or backward flags, respectively, in a memory.

Thus, for the compensated network it is valid:
$I_{WE}$>set value, $E_0$>0=>set forward flag.
$I_{WE}$>set value, $E_0$<0=>set backward flag.
$I_{WE}$<set value=>no direction flag.

Accordingly, for the isolated network it is valid:
$I_{CE}$>set value, $E_{b0}$>0=>set forward flag.
$I_{CE}$>set value, $E_{b0}$<0=>set backward flag.
$I_{CE}$<set value=>no direction flag.

Preferably, flags are set as direction indicators for "forward", "backward" or "no direction", wherein this is done in a memory, particularly in a ring memory having a length $t_{flag}$. The direction indicator is determined for each sampling time nx and the corresponding flag is stored in the ring memory. The subsequently determined earth fault direction for the protection of the network is preferably stored in a second memory. This memory is updated at each time instant by means of the method by verifying if all direction reports or direction indicators, respectively, in the first memory or in the ring memory, respectively, show the same direction. If this is the case, this direction is taken over into the second memory or the display memory, respectively, else the second memory is not changed and the old value is kept. As a standard, the second memory is initialized with "no direction".

The integration time window nFE is adjusted to the network to be currently protected, which can be done by trials or in operation starting from a base value as optimization. Preferably, the estimation of the suitable integration time window is done based on an analysis of the network and particularly based on available earth fault records.

The device of the invention, in an illustrative embodiment for ascertaining an earth fault and the earth-fault direction in a three-phase network operated in a compensated way, is characterized in that the device comprises at least a measurement device adapted to continuously measure value pairs of a zero voltage and of a zero current with a given sample rate, wherein the value pairs are each attributed to a measurement time, furthermore a memory for storing the determined value pairs and the attributed measurement time, and comprising a calculation unit, wherein the calculation unit is adapted to continuously calculate the active energy by forming a product of the measured zero voltage and the measured zero current for each measurement time and to calculate a sum of a product which is attributed to the current measurement time and a number of preceding products, to set for the current measurement time a voltage flag to 1 if the attributed zero voltage is greater than a first threshold value and else to 0, and a current flag to 1 if the attributed zero current is greater than a second threshold value and else to 0, to perform a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present, to verify the algebraic sign of the active energy calculated up to the current measurement time, wherein a result of the verification is ON-delayed by a third time interval and release-delayed by a fourth time interval, and to decide at least on the basis of the algebraic sign of the active energy if the earth fault direction is reported as "forward", in case of a positive algebraic sign, or as "backward" in case of a negative algebraic sign.

In a further illustrative embodiment, for ascertaining an earth fault and the earth-fault direction in a three-phase network operated in an isolated way, the device of the invention is characterized in that the device comprises at least a measurement device which is adapted to continuously measure value pairs of a zero voltage and of a zero current with a given sample rate, wherein the value pairs are each attributed to a measurement time, furthermore a memory for storing the determined value pairs and the attributed measurement time, and comprising a calculation unit, wherein the calculation unit is adapted to continuously calculate the reactive energy by forming a product of the measured zero voltage and of the measured zero current for each measurement time and to calculate a sum of a product which is attributed to the current measurement time and a number of preceding products, to set for the current measurement time a voltage flag to 1 if the attributed zero voltage is greater than a first threshold value and else to 0, and a current flag to 1 if the attributed zero current is greater than a second threshold value and else to 0, to perform a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present, to verify the algebraic sign of the reactive energy calculated up to the current measurement time, wherein a result of the verification is ON-delayed by a third time interval and release-delayed by a fourth time interval, and to decide at least on the basis of the algebraic sign of the reactive energy if the earth fault direction is reported as "forward", in case of a positive algebraic sign, or as "backward" in case of a negative algebraic sign.

The methods and the devices provide the possibility to correctly detect intermittent earth faults in networks operated in an isolated way or in a compensated way, for which simple earth fault direction relays fail because in case of a reignition an erroneous direction is shown. By considering the active and reactive energy in the zero sequence, it is however possible to suppress this effect.

As mentioned at the beginning, the temporal behavior of the fault function strongly depends on the filter algorithms or the integration algorithms, respectively, such that under circumstances wrong direction decisions are issued. The invention is described based on the aforementioned method.

While presently preferred embodiments of the invention are shown and described in this document, it is distinctly understood that the invention is not limited thereto but may be embodied and practiced in other ways within the scope of the following claims. Therefore, terms like "preferred" or "in particular" or "particularly" or "advantageously", etc. signify optional and exemplary embodiments only.

The invention claimed is:

1. Method for ascertaining an earth fault and an earth-fault direction in a three-phase network operated in a compensated way, characterized by the steps of:
    a) using a measurement device adapted to do so, continuously measuring value pairs of a zero voltage and of a zero current with a given sample rate, wherein the value pairs are each attributed to a measurement time, and recording the determined value pairs and the attributed measurement time in a memory; and,
    using a calculation unit adapted to do so,
    b) continuously calculating an active energy by forming a product of the measured zero voltage and the measured zero current for each measurement time and forming a sum of a product which is attributed to the current measurement time and a number of preceding products,
    c) setting for the current measurement time a voltage flag to 1 if the attributed zero voltage is greater than a first threshold value and else to 0, and a current flag to 1 if the attributed zero current is greater than a second threshold value and else to 0,
    d) performing a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present
    e) continuing to execute the steps a) to d) and verifying an algebraic sign of the active energy calculated up to the current measurement time, wherein a result of the verification is ON-delayed by a third time interval and release-delayed by a fourth time interval, and
    f) deciding at least on the basis of the algebraic sign of the active energy if the earth-fault direction is reported as "forward", in case of a positive algebraic sign, or as "backward" in case of a negative algebraic sign.

2. Method according to claim 1, wherein, additionally to the decision based on the algebraic sign of the active energy or of a reactive energy, a verification of an algebraic sign of the active energy or of the reactive energy is carried out by integrating the products of the zero voltage and of the zero current over a period of a network frequency, which includes the current measurement time, wherein the earth fault direction is confirmed if the algebraic sign of the active energy or the reactive energy and of a power match.

3. Method according to claim 1, wherein the sum of step b) is determined in such a way that for each calculation the product attributed to the current measurement time is summed up to the sum and an oldest product of the sum is excluded.

4. Method according to claim 3, wherein the sum is calculated with an adjustable constant number of value pairs.

5. Method according to claim 1, wherein the sample rate is set before a first measurement of the zero current and the zero voltage, and wherein a millisecond is chosen as sample rate.

6. Method according to claim 1, wherein the first time interval and/or the second time interval are/is set before a first measurement of the zero current and of the zero voltage, and wherein both time intervals are 15 ms.

7. Method according to claim 1, wherein the third time interval and/or the fourth time interval are/is set before a first measurement of the zero current and of the zero voltage, particularly wherein both time intervals are chosen from a range between 30 ms and 2000 ms.

8. Method according to claim 1, wherein the first and/or the second threshold value are/is set before a first measurement of the zero current and of the zero voltage.

9. Method according to claim 1, characterized in that the report is issued by setting or not setting forward flags or backward flags, respectively, in a memory.

10. Method for ascertaining a earth fault and an earth-fault direction in a three-phase network operated in an isolated way, characterized by the steps of:
    a) using a measurement device adapted to do so, continuously measuring value pairs of a zero voltage and of a zero current with a given sample rate, wherein the value pairs are each attributed to a measurement time, and recording the determined value pairs and the attributed measurement time in a memory; and, using a calculation unit adapted to do so,
- b) continuously calculating a reactive energy by forming a product of the measured zero voltage and the measured zero current for each measurement time and forming a sum of a product which is attributed to the current measurement time and a number of preceding products,
- c) setting for the current measurement time a voltage flag to 1 if the attributed zero voltage is greater than a first threshold value and else to 0, and a current flag to 1 if the attributed zero current is greater than a second threshold value and else to 0,
- d) performing a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present
- e) continuing to execute the steps a) to d) and verifying an algebraic sign of the reactive energy calculated up to the current measurement time, wherein a result of the verification is ON-delayed by a third time interval and release-delayed by a fourth time interval, and
- f) deciding at least on the basis of the algebraic sign of the reactive energy if the earth fault direction is reported as "forward", in case of a positive algebraic sign, or as "backward" in case of a negative algebraic sign.

11. Device for ascertaining an earth fault and an earth-fault direction in a three-phase network operated in a compensated way, characterized in that the device comprises at least a measurement device adapted to continuously measure value pairs of a zero voltage and of a zero current with a given sample rate, wherein the value pairs are each attributed to a measurement time, furthermore a memory for storing the determined value pairs and the attributed measurement time, and comprising a calculation unit, wherein the calculation unit is adapted

- to continuously calculate an active energy by forming a product of the measured zero voltage and the measured zero current for each measurement time and to calculate a sum of a product which is attributed to the current measurement time and a number of preceding products,
- to set for the current measurement time a voltage flag to 1 if the attributed zero voltage is greater than a first threshold value and else to 0, and a current flag to 1 if the attributed zero current is greater than a second threshold value and else to 0,
- to perform a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present
- to verify an algebraic sign of the active energy calculated up to the current measurement time, wherein a result of the verification is ON-delayed by a third time interval and release-delayed by a fourth time interval, and
- to decide at least on the basis of the algebraic sign of the active energy if the earth fault direction is reported as "forward", in case of a positive algebraic sign, or as "backward" in case of a negative algebraic sign.

12. Device for ascertaining an earth fault and an earth-fault direction in a three-phase network operated in an isolated way, characterized in that the device comprises at least a measurement device which is adapted to continuously measure value pairs of a zero voltage and of a zero current with a given sample rate, wherein the value pairs are each attributed to a measurement time, furthermore a memory for storing the determined value pairs and the attributed measurement time, and comprising a calculation unit, wherein the calculation unit is adapted

- to continuously calculate a reactive energy by forming a product of the measured zero voltage and of the measured zero current for each measurement time and to calculate a sum of a product which is attributed to the current measurement time and a number of preceding products,
- to set for the current measurement time a voltage flag to 1 if the attributed zero voltage is greater than a first threshold value and else to 0, and a current flag to 1 if the attributed zero current is greater than a second threshold value and else to 0,
- to perform a Boolean AND-operation with the voltage flag and the current flag, for each current measurement time, wherein a result of the Boolean AND-operation is ON-delayed by a first time interval and release-delayed by a second time interval, wherein no earth fault is present in case of a result of 0 and an earth fault is present in case of a result of 1, and if an earth fault is present
- to verify an algebraic sign of the reactive energy calculated up to the current measurement time, wherein a result of the verification is ON-delayed by a third time interval and release-delayed by a fourth time interval, and
- to decide at least on the basis of the algebraic sign of the reactive energy if the earth fault direction is reported as "forward", in case of a positive algebraic sign, or as "backward" in case of a negative algebraic sign.

* * * * *